United States Patent
Nakagawa et al.

(10) Patent No.: US 12,313,968 B2
(45) Date of Patent: May 27, 2025

(54) REFLECTIVE MASK BLANK, REFLECTIVE MASK, AND METHOD FOR MANUFACTURING SEMICONDUCTOR DEVICE

(71) Applicant: HOYA CORPORATION, Tokyo (JP)

(72) Inventors: Masanori Nakagawa, Tokyo (JP); Tsutomu Shoki, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 18/731,088

(22) Filed: May 31, 2024

(65) Prior Publication Data
US 2024/0319578 A1   Sep. 26, 2024

Related U.S. Application Data

(63) Continuation of application No. 17/609,166, filed as application No. PCT/JP2020/023951 on Jun. 18, 2020, now Pat. No. 12,072,619.

(30) Foreign Application Priority Data

Jun. 20, 2019 (JP) ................... 2019-114770

(51) Int. Cl.
G03F 1/24      (2012.01)
G03F 1/46      (2012.01)
G03F 7/20      (2006.01)

(52) U.S. Cl.
CPC .......... *G03F 1/24* (2013.01); *G03F 1/46* (2013.01); *G03F 7/2004* (2013.01)

(58) Field of Classification Search
CPC ............ G03F 1/24; G03F 1/46; G03F 7/2004
USPC ............................................................. 430/5
See application file for complete search history.

(56) References Cited

U.S. PATENT DOCUMENTS

| | | | |
|---|---|---|---|
| 9,383,637 B2 | 7/2016 | Onoue et al. | |
| 2008/0318139 A1 | 12/2008 | Dersch et al. | |
| 2010/0304283 A1 | 12/2010 | Hayashi et al. | |
| 2011/0171566 A1 | 7/2011 | Hayashi | |
| 2013/0164660 A1 | 6/2013 | Hayashi | |
| 2016/0187543 A1 | 6/2016 | Bekman et al. | |
| 2019/0369483 A1 | 12/2019 | Ikebe et al. | |
| 2019/0384157 A1 | 12/2019 | Ikebe et al. | |

FOREIGN PATENT DOCUMENTS

| | | |
|---|---|---|
| JP | H06349716 A | 12/1994 |
| JP | 2009021582 A | 1/2009 |
| JP | 2010192503 A | 9/2010 |
| JP | 2016509270 A | 3/2016 |
| JP | 2017151483 A | 8/2017 |
| TW | 201219966 A | 5/2012 |
| TW | 201348856 A | 12/2013 |
| TW | 201842395 A | 12/2018 |
| WO | 2009116348 A1 | 9/2009 |
| WO | 2010050518 A1 | 5/2010 |
| WO | 2018159785 A1 | 9/2018 |

OTHER PUBLICATIONS

U.S. Appl. No. 17/609,166, "Corrected Notice of Allowability", Jul. 11, 2024, 2 pages.
U.S. Appl. No. 17/609,166, "Notice of Allowance", Mar. 6, 2024, 7 pages.
PCT/JP2020/023951, English Translation of "International Search Report", Sep. 15, 2020, 2 pages.
TW113102881, "Office Action", Jun. 13, 2024, 6 pages.

*Primary Examiner* — Christopher G Young
(74) *Attorney, Agent, or Firm* — Sughrue Mion, PLLC

(57) ABSTRACT

A reflective mask blank for manufacturing a reflective mask capable of suppressing peeling of an absorber pattern while suppressing an increase in the thickness of an absorber film when EUV exposure is conducted in an atmosphere including hydrogen gas. A reflective mask blank comprises a substrate, a multilayer reflection film on the substrate, and an absorber film on the multilayer reflection film. The reflective mask blank is characterized in that: the absorber film includes an absorption layer and a reflectance adjustment layer; the absorption layer contains tantalum (Ta), nitrogen (N), and at least one added element selected from hydrogen (H) and deuterium (D); the absorption layer includes a lower surface region including a surface on the substrate side, and an upper surface region including a surface on the side opposite to the substrate; and the concentration (at. %) of the added element in the lower surface region and the concentration (at. %) of the added element in the upper surface region are different.

15 Claims, 3 Drawing Sheets

(C)

(D)

(E)

(A)

REFLECTIVE MASK BLANK, REFLECTIVE MASK, AND METHOD FOR MANUFACTURING SEMICONDUCTOR DEVICE

CROSS-REFERENCE TO RELATED APPLICATIONS

This application is a Continuation of U.S. application Ser. No. 17/609,166, filed Nov. 5, 2021, which is the National Stage of International Application No. PCT/JP2020/023951, filed Jun. 18, 2020, which claims priority to Japanese Patent Application No. 2019-114770, filed Jun. 20, 2019, and the contents of which is incorporated by reference.

TECHNICAL FIELD

The present disclosure relates to a reflective mask used for manufacturing a semiconductor device and the like, and a reflective mask blank used for manufacturing the reflective mask. The present disclosure also relates to a method for manufacturing a semiconductor device using the above reflective mask.

BACKGROUND ART

Types of light sources of exposure apparatuses in manufacturing semiconductor devices have been evolving while wavelengths thereof have been shortened gradually like a g-line having a wavelength of 436 nm, an i-line having a wavelength of 365 nm, a KrF laser having a wavelength of 248 nm, and an ArF laser having a wavelength of 193 nm. In order to achieve finer pattern transfer, extreme ultra violet (EUV) lithography using EUV having a wavelength around 13.5 nm has been developed. In EUV lithography, a reflective mask is used because there are few materials transparent to EUV light. This reflective mask has a basic structure of a mask structure including a low thermal expansion substrate, a multilayer reflective film, a protective film, and a transfer pattern. A multilayer reflective film that reflects exposure light is formed on a low thermal expansion substrate. A protective film for protecting the multilayer reflective film is formed on the multilayer reflective film. A desired transfer pattern is formed on the protective film. In addition, typical examples of the transfer pattern include a binary type reflection mask having a relatively thick absorber pattern that sufficiently absorbs EUV light and a phase shift type reflection mask (half-tone phase shift type reflection mask) having a relatively thin absorber pattern that reduces EUV light by light absorption and generates reflected light having a phase substantially inverted (phase inverted at approximately 180 degrees) with respect to reflected light from the multilayer reflective film. With this phase shift type reflection mask, high transfer optical image contrast can be obtained due to a phase shift effect, as with a transmission type optical phase shift mask. Therefore, the phase shift type reflection mask has a resolution improving effect. In addition, since an absorber pattern (phase shift pattern) of the phase shift type reflection mask has a thin film thickness, a fine and highly accurate phase shift pattern can be formed.

Patent Documents 1 and 2 disclose techniques related to such a reflective mask for EUV lithography and a mask blank for manufacturing the same.

Patent Document 1 describes a reflective mask blank for EUV lithography in which at least a reflection layer that reflects EUV light and an absorber layer that absorbs EUV light are formed in this order on a substrate. Specifically, regarding the reflective mask blank of Patent Document 1, it is described that the absorber layer contains tantalum (Ta), nitrogen (N), and hydrogen (H), and a total content ratio of Ta and N in the absorber layer is 50 to 99.9 at %, and a content ratio of His 0.1 to 50 at %. Patent Document 1 describes that in the reflective mask blank of Patent Document 1, a crystalline state of a film of the absorber layer is amorphous, and stress and surface roughness are also reduced.

In addition, Patent Document 2 describes a reflective mask blank for EUV lithography in which a reflective layer that reflects EUV light and an absorber layer that absorbs EUV light are formed in this order on a substrate. Specifically, regarding the reflective mask blank of Patent Document 2, it is described that the absorber layer contains at least tantalum (Ta), boron (B), nitrogen (N), and hydrogen (H), and in the absorber layer, a content ratio of B is 1 at % or more and less than 5 at %, a content ratio of His 0.1 to 5 at %, a total content ratio of Ta and N is 90 to 98.9 at %, and a composition ratio of Ta and N (Ta:N) is 8:1 to 1:1. As a result, it is described that, in the reflective mask blank of Patent Document 2, a crystalline state of a film of the absorber layer is amorphous, and stress and surface roughness are also reduced. In addition, Patent Document 2 describes that since the reflective mask blank of Patent Document 2 has a low content ratio of B (less than 5 at %) in the absorber layer, there is no problem caused by a decrease in a film forming speed or unstable discharge during film formation when the absorber layer is formed. Specifically, Patent Document 2 describes that there is no possibility of occurrence of problems such as a variation in film composition or film thickness, and further, impossible film formation.

Patent Document 1: WO 2009/116348 A
Patent Document 2: WO 2010/050518 A

DISCLOSURE OF INVENTION

In EUV lithography, it is known that exposure contamination such as carbon film deposition on a reflective mask due to EUV exposure occurs. In order to suppress this, in recent years, a technique of introducing a hydrogen gas into an atmosphere during exposure has been adopted.

As disclosed in Patent Documents 1 and 2, tantalum (Ta) has been conventionally used as a material for forming an absorber film of a reflective mask blank. However, when EUV exposure is performed in the above atmosphere containing a hydrogen gas, a problem that an absorber pattern is peeled off may occur. A reason why such a problem occurs is considered as follows. That is, during EUV exposure, a hydrogen gas in the exposure atmosphere containing a hydrogen gas is absorbed by an absorber pattern as an atomic hydrogen (H). As a result, the volume of the absorber pattern expands, and a compressive stress increases. As a result, a crack is generated at an interface having weak adhesion in a thin film (for example, a protective film) disposed on a side closer to a substrate than the absorber pattern. When the protective film is disposed on the substrate side of the absorber pattern, hydrogen may also intrude into the protective film. When hydrogen intrudes into the protective film, many cracks may be generated at an interface between the protective film and a multilayer reflective film. It is considered that atomic hydrogens (H) gather in a space of the generated crack to become a hydrogen gas, the space thereby expands, and the absorber pattern is peeled off.

Note that in order to solve the problem that the absorber pattern is peeled off by changing the material of the absorber film or the like, it is necessary to prevent an extinction coefficient k of the absorber film from being too low. When the extinction coefficient k of the absorber film is low, it is necessary to thicken the absorber film in order to ensure absorption of predetermined EUV light by the absorber film. When the absorber film is thickened, there arises another problem that a fine pattern cannot be formed due to a shadowing effect of the reflective mask.

Therefore, an aspect of the present disclosure is to provide a reflective mask capable of suppressing peeling of an absorber pattern while suppressing thickening of an absorber film when EUV exposure is performed in an atmosphere containing a hydrogen gas. Another aspect of the present disclosure is to provide a reflective mask blank for manufacturing a reflective mask capable of suppressing peeling of an absorber pattern.

The present inventors have found that by inclusion of hydrogen in an absorber film in advance, there is no room for a new atomic hydrogen (H) to enter the absorber film, and peeling of an absorber pattern can be suppressed. More specifically, the present inventors have found that it is possible to suppress a fluctuation of a film stress due to intrusion of hydrogen into the absorber film and to suppress a state in which the absorber pattern is easily peeled off or a state in which the absorber pattern is actually peeled off. When the absorber film contains hydrogen, the film density of the absorber film decreases, and therefore the extinction coefficient k decreases. Therefore, there arises another problem that the absorber film is thickened. Therefore, the present inventors have found that by changing the hydrogen content of the absorber film in a film thickness direction, it is possible to prevent film peeling of the absorber pattern while suppressing thickening of the absorber film, and have reached the present disclosure.

In order to solve the above problems, the present disclosure has the following configurations.

Configuration 1

Configuration 1 of the present disclosure is a reflective mask blank comprising: a substrate; a multilayer reflective film on the substrate; and an absorber film on the multilayer reflective film, in which
  the absorber film comprises an absorption layer and a reflectance adjustment layer,
  the absorption layer comprises tantalum (Ta), nitrogen (N), and at least one additive element selected from hydrogen (H) and deuterium (D),
  the absorption layer comprises a lower surface region comprising a surface on the substrate side and an upper surface region comprising a surface on a side opposite to the substrate, and
  a concentration (atomic %) of the additive element in the lower surface region is different from a concentration (atomic %) of the additive element in the upper surface region.

Configuration 2

Configuration 2 of the present disclosure is the reflective mask blank according to configuration 1, in which a concentration (atomic %) of the additive element in the lower surface region is higher than a concentration (atomic %) of the additive element in the upper surface region.

Configuration 3

Configuration 3 of the present disclosure is the reflective mask blank according to configuration 1, in which a concentration (atomic %) of the additive element in the upper surface region is higher than a concentration (atomic %) of the additive element in the lower surface region.

Configuration 4

Configuration 4 of the present disclosure is the reflective mask blank according to any one of configurations 1 to 3, in which a content of the additive element in the absorption layer is 0.1 atomic % or more and 30 atomic % or less.

Configuration 5

Configuration 5 of the present disclosure is the reflective mask blank according to any one of configurations 1 to 4, in which the reflectance adjustment layer comprises tantalum (Ta), oxygen (O), and at least one additive element selected from hydrogen (H) and deuterium (D).

Configuration 6

Configuration 6 of the present disclosure is the reflective mask blank according to any one of configurations 1 to 5, comprising a protective film between the multilayer reflective film and the absorber film, in which the protective film comprises ruthenium (Ru) and at least one additive element selected from hydrogen (H) and deuterium (D).

Configuration 7

Configuration 7 of the present disclosure is a reflective mask comprising an absorber pattern in which the absorber film in the reflective mask blank according to any one of configurations 1 to 6 is patterned.

Configuration 8

Configuration 8 of the present disclosure is a method for manufacturing a reflective mask, the method comprising patterning the absorber film of the reflective mask blank according to any one of configurations 1 to 6 to form an absorber pattern.

Configuration 9

Configuration 9 of the present disclosure is a method for manufacturing a semiconductor device, the method comprising: setting the reflective mask according to configuration 7 in an exposure apparatus comprising an exposure light source that emits EUV light; and transferring a transfer pattern onto a resist film formed on a transfer target substrate.

According to the present disclosure, it is possible to provide a reflective mask capable of suppressing peeling of an absorber pattern while suppressing thickening of an absorber film when EUV exposure is performed in an atmosphere containing a hydrogen gas. In addition, according to the present disclosure, it is possible to provide a reflective mask blank for manufacturing a reflective mask capable of suppressing peeling of an absorber pattern.

DESCRIPTION OF EMBODIMENTS

Figure 1:
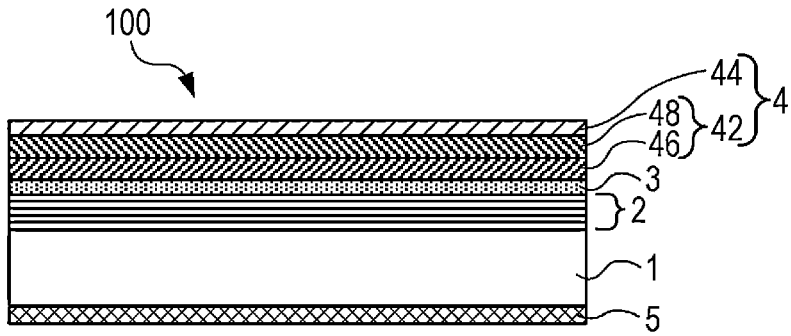
FIG. 1 is a schematic cross-sectional view of a main part for describing a schematic configuration of a reflective mask blank according to an embodiment of the present disclosure.

Hereinafter, embodiments of the present disclosure will be specifically described with reference to the drawings. Note that each of the following embodiments is one mode for embodying the present disclosure and does not limit the present disclosure within the scope thereof. Note that in the drawings, the same or corresponding parts are denoted by the same reference signs, and description thereof may be simplified or omitted.

Configuration of Reflective Mask Blank 100 and Method for Manufacturing the Same FIG. 1 is a schematic cross-sectional view of a main part for describing a configuration of a reflective mask blank 100 according to an embodiment of the present disclosure. As illustrated in FIG. 1, the reflective mask blank 100 according to the present embodiment includes a substrate 1, a multilayer reflective film 2 that is formed on a first main surface (front surface) side and reflects EUV light that is exposure light, and an absorber film 4 that is formed on the multilayer reflective film 2 and absorbs EUV light, and these are layered in this order. In the reflective mask blank 100 according to the present embodiment, the absorber film 4 includes an absorption layer 42 and a reflectance adjustment layer 44 disposed on the absorption layer 42. The absorption layer 42 has a lower surface region 46 including a surface on the substrate 1 side and an upper surface region 48 including a surface on a side opposite to the substrate 1. In addition, the reflective mask blank 100 according to the present embodiment illustrated in FIG. 1 can further include a protective film 3 disposed between the multilayer reflective film 2 and the absorber film 4 for protecting the multilayer reflective film 2. In addition, a conductive back film 5 for an electrostatic chuck can be formed on a side of a second main surface (back surface) of the substrate 1.

Figure 2:
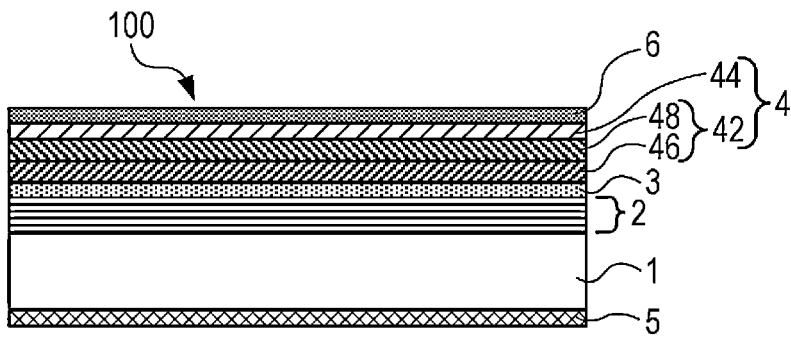
FIG. 2 is a schematic cross-sectional view of a main part for describing a schematic configuration of a reflective mask blank according to another embodiment of the present disclosure.

FIG. 2 illustrates a reflective mask blank 100 according to another embodiment. As illustrated in FIG. 2, the reflective mask blank 100 according to the present embodiment can further include an etching mask film 6 formed on the absorber film 4.

In addition, the reflective mask blank 100 according to another embodiment includes a configuration in which the conductive back film 5 is not formed. Furthermore, the above reflective mask blank 100 includes a configuration of a mask blank with a resist film in which a resist film 11 is formed on the etching mask film 6.

In the present specification, for example, the description of "the multilayer reflective film 2 formed on the substrate 1" or "the multilayer reflective film 2 on the substrate 1" means that the multilayer reflective film 2 is disposed in contact with a surface of the substrate 1 and also means that that another film is disposed between the substrate 1 and the multilayer reflective film 2. The same applies to other films. In addition, in the present specification, for example, the expression "a film A is disposed on a film B in contact with the film B" means that the film A and the film B are disposed in direct contact with each other without another film interposed between the film A and the film B.

In the present specification, hydrogen (H) and/or deuterium (D) contained in a thin film such as the absorber film 4 of the reflective mask blank 100 according to the present embodiment is referred to as an "additive element". In addition, since hydrogen (H) and deuterium (D) exhibit similar properties, some or all of hydrogen (H) constituting a predetermined thin film can be replaced with deuterium atoms (D) unless otherwise described.

Hereinafter, each configuration of the reflective mask blank 100 will be specifically described.

<<Substrate 1>>

As the substrate 1, a material having a low thermal expansion coefficient in a range of 0±5 ppb/° C. is preferably used in order to prevent distortion of an absorber pattern $4a$ due to heat at the time of exposure to EUV light. As the material having a low thermal expansion coefficient in this range, for example, $SiO_2$—$TiO_2$-based glass, multicomponent glass ceramics, and the like can be used.

The first main surface on a side of the substrate 1 on which a transfer pattern (constituted by a pattern obtained by patterning the absorber film 4 described later) is formed has been subjected to a surface treatment so as to have high flatness from a viewpoint of obtaining at least pattern transfer accuracy and position accuracy. In a case of EUV exposure, flatness in an area of 132 mm×132 mm of the main surface on the side of the substrate 1 on which the transfer pattern is formed is preferably 0.1 µm or less, more preferably 0.05 µm or less, and particularly preferably 0.03 µm or less. In addition, the second main surface on a side opposite to the side on which the absorber film 4 is formed is a surface to be electrostatically chucked at the time of setting on an exposure apparatus, and in an area of 142 mm×142 mm of the second main surface, flatness is preferably 0.1 µm or less, more preferably 0.05 µm or less, and particularly preferably 0.03 µm or less.

In addition, high surface smoothness of the substrate 1 is also an extremely important item. Surface roughness of the first main surface of the substrate 1 on which the absorber pattern $4a$ for transfer is formed is preferably 0.1 nm or less in terms of root mean square roughness (RMS). Note that the surface smoothness can be measured with an atomic force microscope.

Furthermore, the substrate 1 preferably has high rigidity in order to prevent deformation due to film stress of a film (such as the multilayer reflective film 2) formed on the substrate 1. In particular, the substrate 1 preferably has a high Young's modulus of 65 GPa or more.

<<Multilayer Reflective Film 2>>

The multilayer reflective film 2 imparts a function that reflects EUV light in a reflective mask 200. The multilayer reflective film 2 is a multilayer film in which layers mainly containing elements having different refractive indices are periodically layered.

Generally, as the multilayer reflective film 2, there is used a multilayer film in which a thin film (high refractive index layer) of a light element that is a high refractive index material or a compound of the light element and a thin film (low refractive index layer) of a heavy element that is a low refractive index material or a compound of the heavy element are alternately layered for about 40 to 60 periods. The multilayer film may be formed by counting, as one period, a stack of a high refractive index layer and a low refractive index layer in which the high refractive index layer and the low refractive index layer are layered in this order from the substrate 1 side and building up the stacks for a plurality of periods. Alternatively, the multilayer film may be formed by counting, as one period, a stack of a low refractive index layer and a high refractive index layer in which the low refractive index layer and the high refractive index layer are layered in this order from the substrate 1 and building up the stacks for a plurality of periods. Note that a layer on an outermost surface of the multilayer reflective film 2, that is, a surface layer of the multilayer reflective film 2 on a side opposite to the substrate 1 is preferably a high refractive index layer. In the multilayer film described above, when a stack of a high refractive index layer and a low refractive index layer in which the high refractive index layer and the low refractive index layer are layered in this order from the substrate 1 is counted as one period and the stacks are built up for a plurality of periods, the uppermost layer is the low refractive index layer. In this case, if the low refractive index layer constitutes the outermost surface of the multilayer reflective film 2, the low refractive index layer is easily oxidized and the reflectance of the reflective mask 200 is reduced. Therefore, it is preferable to further form a high refractive index layer on the low refractive index layer that is the uppermost layer to form the multilayer reflective film 2. Meanwhile, in the multilayer film described above, when a stack of a low refractive index layer and a high refractive index layer in which the low refractive index layer and the high refractive index layer are layered in this order from the substrate 1 side is counted as one period and the stacks are built up for a plurality of periods, the uppermost layer is the high refractive index layer, which is good as it is.

In the present embodiment, a layer containing silicon (Si) is adopted as the high refractive index layer. As a material including Si, a Si compound including boron (B), carbon (C), nitrogen (N), and oxygen (O) in Si may be used in addition to Si alone. By using the layer containing Si as the high refractive index layer, the reflective mask 200 for EUV lithography having an excellent EUV light reflectance can be obtained. In addition, in the present embodiment, a glass substrate is preferably used as the substrate 1. Si also has excellent adhesion to the glass substrate. In addition, as the low refractive index layer, a metal alone selected from molybdenum (Mo), ruthenium (Ru), rhodium (Rh), and platinum (Pt), or an alloy thereof is used. For example, as the multilayer reflective film 2 for EUV light having a wavelength of 13 nm to 14 nm, a Mo/Si periodic layered film in which a Mo film and a Si film are alternately layered for about 40 to 60 periods is preferably used. Note that a high refractive index layer that is the uppermost layer of the multilayer reflective film 2 may be formed of silicon (Si), and a silicon oxide layer containing silicon and oxygen may be formed between the uppermost layer (Si) and the Ru-based protective film 3. This makes it possible to improve mask cleaning resistance.

The reflectance of such a multilayer reflective film 2 alone is usually 65% or more, and an upper limit thereof is usually 73%. Note that the thickness and period of each constituent layer of the multilayer reflective film 2 only need to be appropriately selected according to an exposure wavelength and are selected so as to satisfy the Bragg reflection law. In the multilayer reflective film 2, there are a plurality of high refractive index layers and a plurality of low refractive index layers, but thickness does not need to be the same between the high refractive index layers and between the low refractive index layers. In addition, the film thickness of the Si layer on the outermost surface of the multilayer reflective film 2 can be adjusted within a range that does not lower the reflectance. The film thickness of Si (high refractive index layer) on the outermost surface can be 3 nm to 10 nm.

A method for forming the multilayer reflective film 2 is publicly known in this technical field. For example, the multilayer reflective film 2 can be formed by forming each layer in the multilayer reflective film 2 by an ion beam sputtering method. In the case of the above-described Mo/Si periodic multilayer film, for example, by an ion beam sputtering method, first, a Si film having a thickness of about 4 nm is formed on the substrate 1 using a Si target, and then a Mo film having a thickness of about 3 nm is formed using a Mo target. This stack of a Si film and a Mo film is counted as one period and the stacks are build up for 40 to 60 periods to form the multilayer reflective film 2 (the layer on the outermost surface is a Si layer). In addition, when the multilayer reflective film 2 is formed, the multilayer reflective film 2 is preferably formed by supplying krypton (Kr) ion particles from an ion source and performing ion beam sputtering.

<<Protective Film 3>>

The reflective mask blank 100 according to the present embodiment preferably includes the protective film 3 between the multilayer reflective film 2 and the absorber film 4. The protective film 3 is formed on the multilayer reflective film 2, and it is thereby possible to suppress damage to a surface of the multilayer reflective film 2 when the reflective mask 200 (EUV mask) is manufactured using the reflective mask blank 100. Therefore, a reflectance characteristic for EUV light is improved.

The protective film 3 is formed on the multilayer reflective film 2 in order to protect the multilayer reflective film 2 from dry etching and cleaning in a process for manufacturing the reflective mask 200 described later. In addition, the protective film 3 also protects the multilayer reflective film 2 when a black defect of the absorber pattern 4a is repaired using an electron beam (EB). The protective film 3 is formed of a material having resistance to an etchant, a cleaning liquid, and the like. Here, FIG. 1 illustrates a case where the protective film 3 has one layer, but the protective film 3 can have a stack of three or more layers. For example, the protective film 3 may be one in which a lowermost layer and an uppermost layer are layers containing the substance containing Ru, and a metal or an alloy other than Ru is interposed between the lowermost layer and the uppermost layer. The protective film 3 can contain, for example, a material containing ruthenium as a main component. That is, the material of the protective film 3 may be a Ru metal alone or a Ru alloy containing at least one kind of metal selected from titanium (Ti), niobium (Nb), molybdenum (Mo), zirconium (Zr), yttrium (Y), boron (B), lanthanum (La), cobalt (Co), rhenium (Re), and the like in Ru, and may contain nitrogen. Such a protective film 3 is particularly effective when the absorption layer 42 of the absorber film 4 is patterned by dry etching of a chlorine-based gas (Cl-based gas). The protective film 3 is preferably formed of a material having an etching selective ratio of 1.5 or more, preferably 3 or more, the etching selective ratio being an etching selective ratio of the absorber film 4 to the protective film 3 in dry etching using a chlorine-based gas (etching speed of the absorber film 4/etching speed of the protective film 3).

The Ru content of this Ru alloy is 50 atomic % or more and less than 100 atomic %, preferably 80 atomic % or more and less than 100 atomic %, and more preferably 95 atomic % or more and less than 100 atomic %. In particular, when the Ru content of the Ru alloy is 95 atomic % or more and less than 100 atomic %, the protective film 3 can have mask cleaning resistance, an etching stopper function when the absorber film 4 is etched, and a protective film function of preventing a change of the multilayer reflective film 2 with time while suppressing diffusion of an element (silicon) constituting the multilayer reflective film 2 into the protective film 3 and sufficiently ensuring the reflectance of EUV light.

The protective film 3 of the reflective mask blank 100 according to the present embodiment preferably contains ruthenium (Ru) and at least one additive element selected from hydrogen (H) and deuterium (D). When the protective film 3 contains an additive element (hydrogen (H) and/or deuterium (D)), the total content of the additive elements is preferably more than 5 atomic %, and more preferably 10 atomic % or more. By inclusion of the protective film 3 between the multilayer reflective film 2 and the absorber film 4, it is possible to suppress damage to a surface of the multilayer reflective film 2 when the reflective mask 200 is manufactured using the reflective mask blank 100. In addition, by using a predetermined material as a material of the protective film 3, adhesion between the multilayer reflective film 2 and the absorber film 4 can be further enhanced. Therefore, it is possible to more reliably suppress peeling of the protective film 3 and the absorber pattern 4a. Furthermore, since the protective film 3 contains at least one additive element selected from hydrogen (H) and deuterium (D), film peeling caused by an interface of the protective film 3 can be suppressed.

Note that when the total content of the additive elements (hydrogen (H) and/or deuterium (D)) in the protective film 3 is larger than the total content of the additive elements in the absorption layer 42, the total content of hydrogen (H) or deuterium (D) in the protective film 3 does not necessarily need to be more than 5 atomic %, and can be 5 atomic % or less.

Note that according to findings by the present inventors, when the total content of the additive elements (hydrogen (H) and/or deuterium (D)) in the protective film 3 is more than 5 atomic %, film peeling caused by an interface of the protective film 3 may be sufficiently prevented. In this case, the absorber film 4 does not necessarily need to contain the additive element, or only needs to contain the additive element at a low concentration in some cases.

That is, the reflective mask blank 100 according to the embodiment in this case is the reflective mask blank 100 including the multilayer reflective film 2, the protective film 3, and the absorber film 4 in this order on the substrate 1. The absorber film 4 of the reflective mask blank 100 contains tantalum (Ta) and at least one additive element selected from hydrogen (H) and deuterium (D). The protective film 3 of the reflective mask blank 100 contains ruthenium (Ru) and at least one additive element selected from hydrogen (H) and deuterium (D). The content of the additive element in the protective film 3 of the reflective mask blank 100 is more than 5 atomic %. By using such a reflective mask blank 100, it is also possible to suppress film peeling of the absorber pattern 4a of the reflective mask 200.

In EUV lithography, since there are few substances that are transparent to exposure light, it is not technically easy to achieve an EUV pellicle that prevents foreign matters from adhering to a mask pattern surface. For this reason, pellicleless operation without using a pellicle has been the mainstream. In addition, in EUV lithography, exposure contamination such as carbon film deposition on a mask or an oxide film growth due to EUV exposure occurs. Therefore, it is necessary to frequently clean and remove foreign matters and contamination on the EUV reflective mask 200 at a stage where the EUV reflective mask 200 is used for manufacturing a semiconductor device. For this reason, the EUV reflective mask 200 is required to have extraordinary mask cleaning resistance as compared with a transmission type mask for optical lithography. When the Ru-based protective film 3 containing Ti is used, cleaning resistance to a cleaning liquid such as sulfuric acid, sulfuric acid peroxide (SPM), ammonia, ammonia peroxide (APM), OH radical cleaning water, or ozone water having a concentration of 10 ppm or less is particularly high, and requirement for mask cleaning resistance can be satisfied.

The thickness of such a protective film 3 containing Ru or an alloy thereof is not particularly limited as long as a function as the protective film 3 can be performed. The thickness of the protective film 3 is preferably 1.0 nm to 8.0 nm, and more preferably 1.5 nm to 6.0 nm from a viewpoint of the reflectance of EUV light.

As a method for forming the protective film 3, it is possible to adopt a film forming method similar to a publicly known one without any particular limitation. Specific examples thereof include a sputtering method and an ion beam sputtering method.

<<Absorber Film 4>>

In the reflective mask blank 100 according to the present embodiment, the absorber film 4 that absorbs EUV light is formed on the multilayer reflective film 2 (on the protective film 3 when the protective film 3 is formed). The absorber film 4 has a function of absorbing EUV light. The absorber film 4 according to the present embodiment includes the absorption layer 42 and the reflectance adjustment layer 44 disposed on the absorption layer 42 (on a surface opposite to the substrate 1 out of the two surfaces of the absorption layer 42).

The absorber film 4 according to the present embodiment includes the absorption layer 42. The absorption layer 42 contains tantalum (Ta), nitrogen (N), and at least one additive element selected from hydrogen (H) and deuterium (D). Since the absorber film 4 contains an additive element such as hydrogen in advance, it is possible to obtain the reflective mask 200 capable of eliminating room for a new atomic hydrogen (H) to enter the absorber film and suppressing peeling of the absorber pattern 4a when EUV exposure is performed in an atmosphere containing a hydrogen gas.

As illustrated in FIGS. 1 and 2, the absorption layer 42 of the reflective mask blank 100 according to the present embodiment includes the lower surface region 46 including a surface on the substrate 1 side and the upper surface region 48 including a surface on a side opposite to the substrate 1. In the present embodiment, the concentration (atomic %) of the additive element in the lower surface region 46 of the absorption layer 42 is different from the concentration (atomic %) of the additive element in the upper surface region 48. By adding the additive element to a necessary portion (the lower surface region 46 or the upper surface region 48) of the absorber film at a higher concentration, a decrease in the film density of the absorber film can be prevented, and therefore thickening of the absorber film can be suppressed. Therefore, by changing the hydrogen content of the absorber film 4 in the film thickness direction, it is possible to obtain the reflective mask 200 capable of suppressing peeling of the absorber pattern 4a when EUV exposure is performed in an atmosphere containing a hydrogen gas while suppressing thickening of the absorber film 4.

Note that, in the present specification, a layer including the lower surface region 46 in the absorption layer 42 may be referred to as a lower layer. Similarly, a layer including the upper surface region 48 may be referred to as an upper layer. In addition, an intermediate region can be included between the lower layer and the upper layer. Note that in the example of FIGS. 1 and 2, the lower layer is the same as the lower surface region 46, the upper layer is the same as the upper surface region 48, and there is no intermediate region.

The lower surface region 46 is a region including a surface on the substrate 1 side in the absorption layer 42 of the absorber film 4. In the example illustrated in FIGS. 1 and 2, the lower surface region 46 is a region including a surface in contact with the protective film 3 (referred to as "lower surface" in the present specification) out of the surfaces (interfaces) of the absorber film 4 and including the vicinity of the surface. In addition, the upper surface region 48 is a region including a surface on a side opposite to the substrate 1 (referred to as "upper surface" in the present specification) out of the two surfaces (interfaces) of the absorption layer 42 of the absorber film 4. In the example illustrated in FIGS. 1 and 2, the upper surface region 48 is a region including a surface in contact with the reflectance adjustment layer 44 of the absorber film 4 and including the vicinity of the surface. The absorption layer 42 can include only two regions of the lower surface region 46 and the upper surface region 48. In this case, the lower surface region 46 corresponds to the lower layer, and the upper surface region 48 corresponds to the upper layer. In addition, the absorption layer 42 can include an intermediate region (not illustrated) between the lower surface region 46 and the upper surface region 48. The lower surface region 46 and the upper surface region 48 have different concentrations of the additive element. However, concentration ratios of elements other than the additive element, in particular, concentration ratios of two elements of tantalum (Ta) and nitrogen (N) can be basically the same as each other. However, a concentration distribution of a predetermined element in each of the lower surface region 46 and the upper surface region 48 does not need to be uniform. The concentration of a predetermined element in each of the lower surface region 46 and the upper surface region 48 can be an average concentration of the predetermined element in each of the regions.

In the present embodiment, the concentration (atomic %) of the additive element in the lower surface region 46 can be higher than the concentration (atomic %) of the additive element in the upper surface region 48. By setting the concentration of the additive element in the lower surface region 46 higher than that in the upper surface region 48, even when hydrogen tries to intrude from a side wall of the absorber pattern 4a, it is possible to suppress intrusion of hydrogen from the lower surface region 46 to an interface between the absorption layer 42 and a layer below the absorption layer 42. Therefore, it is possible to more reliably suppress peeling of the protective film 3 and the absorber pattern 4a. In addition, since the concentration of the additive element in the upper surface region 48 is relatively low, a decrease in the film density of the upper surface region 48 can be prevented. Therefore, thickening of the absorber film 4 can be prevented. A ratio of the film thickness of the lower surface region 46 to the film thickness of the absorption layer 42 (film thickness of lower surface region 46/film thickness of absorption layer 42) is preferably 0.1 or more, and more preferably 0.2 or more.

In the present embodiment, the concentration (atomic %) of the additive element in the upper surface region 48 can be higher than the concentration (atomic %) of the additive element in the lower surface region 46. By setting the concentration of the additive element in the upper surface region 48 higher than that in the lower surface region 46, it is possible to suppress intrusion of hydrogen from a surface of the absorber pattern 4a. Therefore, it is possible to more reliably suppress peeling of the protective film 3 and the absorber pattern 4a. In addition, since the concentration of the additive element in the lower surface region 46 is relatively low, a decrease in the film density of the lower surface region 46 can be prevented. Therefore, thickening of the absorber film 4 can be prevented. A ratio of the film thickness of the upper surface region 48 to the film thickness of the absorption layer 42 (film thickness of upper surface region 48/film thickness of absorption layer 42) is preferably 0.1 or more, and more preferably 0.2 or more.

The content of the additive element (hydrogen (H) and/or deuterium (D)) in the lower surface region 46 can be uniform or substantially uniform throughout the lower surface region 46. In addition, the content of the additive element (hydrogen (H) and/or deuterium (D)) in the upper surface region 48 can be uniform or substantially uniform throughout the upper surface region 48. In addition, the content of the additive element in the lower surface region 46 and/or the upper surface region 48 can have a predetermined concentration distribution. Addition of the additive element to the absorption layer 42 tends to reduce the film density of the absorber film 4. Therefore, it is preferable to add the additive element to the absorption layer 42 only in a necessary region. For this purpose, as described above, the concentration of the additive element in one of the upper surface region 48 and the lower surface region 46 needs to be higher than that in the other of the upper surface region 48 and the lower surface region 46. It can be determined which of the concentration in the upper surface region 48 and the concentration in the lower surface region 46 is set to be higher by examining into which of the upper surface region 48 and the lower surface region 46 hydrogen is likely to intrude in consideration of the concentration of a hydrogen gas in an exposure atmosphere and the like.

An intermediate region can be disposed between the lower surface region 46 and the upper surface region 48 of the absorption layer 42. A concentration distribution of the additive element in the intermediate region is arbitrary. The concentration distribution of the additive element in the absorption layer 42 (intermediate region when the lower surface region 46, the upper surface region 48, and the intermediate region are included) can be a distribution that monotonically decreases or monotonically increases in a depth direction. When the concentration of the additive element in the lower surface region 46 is lower than the concentration of the additive element in the upper surface region 48, the concentration of the additive element in the absorption layer 42 can monotonously decrease from the upper surface region 48 toward the lower surface region 46 in the depth direction of the absorption layer 42. In addition, when the concentration of the additive element in the lower surface region 46 is higher than the concentration of the additive element in the upper surface region 48, the concentration of the additive element in the absorption layer 42 can monotonically increase from the upper surface region 48 toward the lower surface region 46 in the depth direction of the absorption layer 42. Also in the upper surface region 48, the concentration of the additive element can monotonically decrease or monotonically increase in the depth direction. Similarly, also in the lower surface region 46, the concentration of the additive element can monotonically decrease or monotonically increase in the depth direction. The concentration of the additive element in the depth direction can uniformly change in an inclined manner or can change (increase or decrease) in a stepwise manner. In the present specification, a monotonous decrease in the concentration of an element includes a stepwise decrease in the concentration of the element. In the present specification, a monotonous increase in the concentration of an element includes a stepwise increase in the concentration of the element.

The content of tantalum in the absorption layer 42 including the lower surface region 46 and the upper surface region 48 is preferably 40 atomic % or more, more preferably 50 atomic % or more, and still more preferably 60 atomic % or more. The content of tantalum in the absorption layer 42 is preferably 95 atomic % or less. An upper limit of the content of nitrogen in the absorption layer 42 is preferably 50 atomic % or less, and more preferably 30 atomic % or less.

The content of the additive element (hydrogen (H) and/or deuterium (D)) (the total content of both hydrogen (H) and deuterium (D) when both hydrogen (H) and deuterium (D) are contained) in the absorption layer 42 including the lower surface region 46 and the upper surface region 48 is 0.1 atomic % or more and 30 atomic % or less, preferably 5 atomic % or more, more preferably 10 atomic % or more, and still more preferably more than 15 atomic %. Since the absorption layer 42 contains hydrogen (H) and/or deuterium (D) as an additive element, it is possible to eliminate room for a new atomic hydrogen (H) to enter the absorber film 4 at the time of EUV exposure in an exposure atmosphere containing a hydrogen gas. Therefore, by using the reflective mask blank 100 according to the present embodiment, it is possible to more reliably suppress peeling of the absorber pattern 4a of the reflective mask 200. In addition, when the content of the additive element is more than 30 atomic %, the film density of the absorption layer 42 decreases, the extinction coefficient k decreases, and it is difficult for the absorption layer 42 to have a function of absorbing EUV light.

A similar effect can be obtained even when either additive element of hydrogen (H) and deuterium (D) is used from a viewpoint of reducing intrusion of an atomic hydrogen (H) into the absorption layer 42 at the time of EUV exposure in an exposure atmosphere containing a hydrogen gas. However, deuterium (D) has a stronger bond with another element than hydrogen (H) in the absorption layer 42, and therefore can be stably present in the absorption layer 42. Therefore, deuterium (D) is preferably used as an additive element of the absorption layer 42.

The absorption layer 42 can contain boron (B). The content of boron (B) in the absorption layer 42 is more than 5 atomic %, and preferably 10 atomic % or more and 30 atomic % or less. When the absorber film 4 contains boron (B), it is easy to amorphize a crystal structure, and the absorber film 4 having excellent smoothness can be obtained. In addition, in the present embodiment, the absorber film 4 contains hydrogen in order to suppress peeling of the absorber pattern 4a. When the absorber film 4 contains hydrogen, the film density of the absorber film 4 is likely to decrease. Since the absorber film 4 according to the present embodiment contains boron, it is possible to obtain the absorber film 4 having an amorphous structure in which a decrease in film density is suppressed.

Note that when the absorption layer 42 contains boron (B), the content of nitrogen is preferably smaller than the content of boron. This is because as the content of nitrogen is smaller, an etching rate with a chlorine gas is higher and the absorption layer 42 is more easily removed.

In addition, when the absorption layer 42 contains boron (B), only one of the lower surface region 46 (lower layer) and the upper surface region 48 (upper layer) can contain boron (B). In addition, both the lower surface region 46 (lower layer) and the upper surface region 48 (upper layer) can contain boron (B).

In the absorber film 4, a material of the lower layer including the lower surface region 46 is preferably a TaNH film or a TaBNH film when the lower layer contains the additive element, and is preferably a TaN film or a TaBN film when the lower layer does not contain the additive element. Similarly to the lower layer, in the absorber film 4, a material of the upper layer including the upper surface region 48 is preferably a TaNH film or a TaBNH film when the upper layer contains the additive element, and is preferably a TaN film or a TaBN film when the upper layer does not contain the additive element. In order to obtain the absorber film 4 having excellent smoothness, the materials of the lower surface region 46 (lower layer) and the upper surface region 48 (upper layer) of the absorber film 4 more preferably contain boron (B). Note that in the above materials, hydrogen (H) can be replaced with deuterium (D).

The absorption layer 42 made of the above-described material can be formed by a magnetron sputtering method such as a DC sputtering method or an RF sputtering method. For example, the absorption layer 42 can be formed using a target containing tantalum by a reactive sputtering method using a rare gas such as an argon (Ar) gas, a krypton (Kr) gas, and/or a xenon (Xe) gas containing a nitrogen gas and an additive element gas (a hydrogen (H) gas and/or a deuterium (D) gas). Note that when one of the lower surface region 46 and the upper surface region 48 does not contain the additive element, the absorption layer 42 can be formed by a reactive sputtering method using a rare gas not containing the additive element gas and containing a nitrogen gas. In addition, when the absorption layer 42 contains boron (B), the absorption layer 42 can be formed using a target containing tantalum and boron.

Note that power at the time of forming the absorption layer 42 is preferably lowered by a magnetron sputtering method such that the absorption layer 42 contains hydrogen. Meanwhile, when the power at the time of forming the absorption layer 42 is lowered, another problem that a tensile stress in a thin film to be formed increases and a deformation amount of the substrate 1 increases may occur. The present inventors have found that by specifying a composition ratio between hydrogen and nitrogen in the absorption layer 42, film peeling of the absorber pattern 4a can be prevented while a film stress of the absorber film 4 is reduced. That is, by setting, in the composition of the absorption layer 42, the content of nitrogen (N) to 0.1 atomic % or more and 40 atomic % or less, the content of the additive element to 0.1 atomic % or more and 30 atomic % or less, and a composition ratio between the additive element and nitrogen (N) (additive element:nitrogen) to 5:95 to 50:50, preferably 15:85 to 40:60, another problem that a tensile stress in a thin film of the absorption layer 42 to be formed increases and a deformation amount of the substrate 1 increases can be suppressed.

The film thickness of the absorption layer 42 is preferably 30 nm or more, and more preferably 40 nm or more. In addition, the film thickness of the absorption layer 42 is preferably 80 nm or less and more preferably 70 nm or less.

As illustrated in FIGS. 1 and 2, the absorber film 4 according to the present embodiment includes the reflectance adjustment layer 44 on the absorption layer 42 (on a side opposite to the substrate 1).

By forming the absorber film 4 as a layered film including the reflectance adjustment layer 44 on the absorption layer 42 and setting the film thickness of the reflectance adjustment layer 44 to a predetermined film thickness, for example, at the time of mask pattern defect inspection using inspection light such as DUV light, the reflectance adjustment layer 44 serves as a film for adjusting a reflectance. Therefore, inspection sensitivity at the time of mask pattern defect inspection can be increased. For example, when a material of the reflectance adjustment layer 44 is TaBO, by setting the film thickness to about 14 nm, the reflectance adjustment layer 44 effectively functions as a film for adjusting a reflectance at the time of mask pattern defect inspection.

The reflectance adjustment layer 44 preferably contains tantalum (Ta), oxygen (O), and at least one additive element selected from hydrogen (H) and deuterium (D). Similarly to the absorption layer 42, since the reflectance adjustment layer 44 contains a predetermined additive element, it is possible to suppress intrusion of an atomic hydrogen (H) from the reflectance adjustment layer 44 when EUV exposure is performed in an atmosphere containing a hydrogen gas. Therefore, it is possible to obtain the reflective mask 200 capable of suppressing peeling of the absorber pattern 4a.

When the reflectance adjustment layer 44 contains a predetermined additive element, the content of the additive element in the reflectance adjustment layer 44 is preferably 0.1 atomic % or more and 30 atomic % or less, and more preferably more than 15 atomic % and 30 atomic % or less. In addition, the content of the additive element in the reflectance adjustment layer 44 is preferably higher by 10 atomic % or more than the content of the additive element in the absorption layer 42. When the content of the additive element in the reflectance adjustment layer 44 is in a predetermined range, it is more reliable to obtain the reflective mask 200 capable of suppressing peeling of the absorber pattern 4a.

The reflectance adjustment layer 44 preferably further contains boron (B). When the reflectance adjustment layer 44 contains boron (B), it is easy to amorphize a crystal structure, and the absorber film 4 having excellent smoothness can be obtained. In order to reliably achieve amorphization, the content of boron (B) in the reflectance adjustment layer 44 is preferably more than 5 atomic %, and more preferably 10 atomic % or more and 30 atomic % or less.

As described above, the material of the reflectance adjustment layer 44 contains tantalum (Ta) and oxygen (O), and as necessary, a predetermined additive element (hydrogen (H) and/or deuterium (D)) and/or boron (B). The reflectance adjustment layer 44 is preferably a TaO film or a TaBO film. When the reflectance adjustment layer 44 contains the additive element, a TaOH film (or a TaOD film) or a TaBOH film (or a TaBOD film) is preferably used.

The reflectance adjustment layer 44 made of the above-described material can be formed by a magnetron sputtering method such as a DC sputtering method or an RF sputtering method. For example, the reflectance adjustment layer 44 containing a predetermined additive element and boron (B) can be formed using a target containing tantalum and boron by a reactive sputtering method using a rare gas such as an argon (Ar) gas, a krypton (Kr) gas, and/or a xenon (Xe) gas containing an oxygen gas and an additive element gas (a hydrogen (H) gas and/or a deuterium (D) gas). In addition, for example, when the reflectance adjustment layer 44 does not contain a predetermined additive element, the reflectance adjustment layer 44 can be formed using a target containing tantalum and boron by a reactive sputtering method using a rare gas containing an oxygen gas. When the reflectance adjustment layer 44 does not contain boron (B), the reflectance adjustment layer 44 can be formed using a target containing tantalum.

The film thickness of the reflectance adjustment layer 44 is preferably 15 nm or less and more preferably 8 nm or less. In addition, the film thickness of the absorber film 4 is preferably 90 nm or less and more preferably 80 nm or less. In addition, the surface roughness (RMS) of the surface of the absorber film 4 is preferably 0.5 nm or less. Ta, which is a material of the absorber film 4 according to the present embodiment, has a large absorption coefficient (extinction coefficient) of EUV light and can be easily dry-etched with a chlorine-based gas and/or a fluorine-based gas. Therefore, Ta can be said to be a material of the absorber film 4 having excellent processability. By further adding B (further adding Si and/or Ge and the like) to Ta, an amorphous material can be easily obtained. As a result, the smoothness of the absorber film 4 can be improved. In addition, when N and/or O is added to Ta, resistance of the absorber film 4 to oxidation is improved, and therefore an effect of improving stability over time can be obtained.

For etching the absorber film 4 according to the present embodiment, $CF_4$, $CHF_3$, $C_2F_6$, $C_3F_6$, $C_4F_6$, $C_4F_8$, $CH_2F_2$, $CH_3F$, $C_3F_8$, $SF_6$, $F_2$, and the like can be used as a fluorine-based gas. As a chlorine-based gas, $Cl_2$, $SiCl_4$, $CHCl_3$, $CCl_4$, $BCl_3$, and the like can be used. In addition, each of these etching gases can further contain an inert gas such as He and/or Ar as necessary.

In the reflective mask blank 100 according to the present embodiment, by using the above-described absorber film 4, it is possible to obtain the reflective mask 200 capable of suppressing peeling of the absorber pattern 4a while suppressing thickening of the absorber film 4 when EUV exposure is performed in an atmosphere containing a hydrogen gas.

The absorber film 4 according to the present embodiment can be the absorber film 4 having a phase shift function in consideration of a phase difference of EUV light. The absorber film 4 having a phase shift function absorbs EUV light and reflects a part of the EUV light to shift a phase. That is, in the reflective mask 200 in which the absorber film 4 having a phase shift function is patterned, in a portion where the absorber film 4 is formed, a part of light is reflected at a level that does not adversely affect pattern transfer while EUV light is absorbed and attenuated. In addition, in a region (field portion) where the absorber film 4 is not formed, EUV light is reflected from the multilayer reflective film 2 via the protective film 3. Therefore, there is a desired phase difference between reflected light from the absorber film 4 having a phase shift function and reflected light from the field portion. The absorber film 4 having a phase shift function is formed such that the phase difference between reflected light from the absorber film 4 and reflected light from the multilayer reflective film 2 is 170 to 190 degrees. Beams of light having a reversed phase difference in the vicinity of 180 degrees interfere with each other at a pattern edge portion, and an image contrast of a projected optical image is thereby improved. As the image contrast is improved, resolution is increased, and various exposure-related margins such as an exposure margin and a focus margin can be increased.

<<Etching Mask Film 6>>

The reflective mask blank 100 according to the present embodiment can include the etching mask film 6 on the absorber film 4.

Examples of a material of the etching mask film 6 having a high etching selective ratio of the absorber film 4 (particularly reflectance adjustment layer 44) to the etching mask film 6 include a chromium material and a chromium compound material. In this case, the absorber film 4 can be etched with a fluorine-based gas or a chlorine-based gas. Examples of the chromium compound include a material containing chromium (Cr) and at least one element selected from nitrogen (N), oxygen (O), carbon (C), and boron (B). Examples of the chromium compound include CrN, CrC, CrO, CrON, CrOC, CrCN, CrCON, CrBN, CrBC, CrBO, CrBC, CrBON, CrBCN, and CrBOCN. In addition, examples thereof include materials obtained by adding hydrogen (H) and/or deuterium (D) to these chromium compounds. In order to increase the etching selective ratio with a chlorine-based gas, it is preferable to use a material containing substantially no oxygen for the etching mask film 6. Examples of the chromium compound containing substantially no oxygen include CrN, CrC, CrCN, CrBN, CrBC, CrBCN, and materials obtained by adding H and/or D to these chromium compounds. The Cr content of the chromium compound in the etching mask film 6 is preferably 50 atomic % or more and less than 100 atomic %, and more preferably 80 atomic % or more and less than 100 atomic %. In addition, the expression of "containing substantially no oxygen" corresponds to a chromium compound having an oxygen content of 10 atomic % or less, preferably 5 atomic % or less. Note that the material can contain a metal other than chromium within a range in which the effects of the present embodiment can be obtained.

When the etching mask film 6 is formed, the film thickness of the resist film 11 can be reduced, which is advantageous for miniaturization of a pattern. The film thickness of the etching mask film 6 is desirably 3 nm or more from a viewpoint of obtaining a function as an etching mask for accurately forming a transfer pattern on the absorber film 4. In addition, the film thickness of the etching mask film 6 is desirably 15 nm or less, and more preferably 10 nm or less from a viewpoint of reducing the film thickness of the resist film 11.

<<Resist Film 11>>

The reflective mask blank 100 according to the present embodiment can include the resist film 11 on the absorber film 4 (on the etching mask film 6 when the etching mask film 6 is formed). The reflective mask blank 100 according to the present embodiment also includes a form including the resist film 11. In the reflective mask blank 100 according to the present embodiment, by selecting the absorber film 4 (the absorption layer 42 and the reflectance adjustment layer 44) having an appropriate material and/or an appropriate film thickness and an etching gas, the resist film 11 can also be thinned.

As a material of the resist film 11, for example, a chemically-amplified resist (CAR) can be used. By patterning the resist film 11 and etching the absorber film 4 (the absorption layer 42 and the reflectance adjustment layer 44), the reflective mask 200 having a predetermined transfer pattern can be manufactured.

<<Conductive Back Film 5>>

The conductive back film 5 for an electrostatic chuck is generally formed on the second main surface (back surface) side of the substrate 1 (side opposite to the multilayer reflective film 2 forming surface). An electrical characteristic (sheet resistance) required for the conductive back film 5 for an electrostatic chuck is usually 100Ω/□ (Ω/square) or less. The conductive back film 5 can be formed, for example, by a magnetron sputtering method or an ion beam sputtering method using a target of a metal such as chromium or tantalum or an alloy thereof.

A material containing chromium (Cr) for the conductive back film 5 is preferably a Cr compound containing Cr and at least one selected from boron, nitrogen, oxygen, and carbon. Examples of the Cr compound include CrN, CrON, CrCN, CrCON, CrBN, CrBON, CrBCN, and CrBOCN.

As a material containing tantalum (Ta) for the conductive back film 5, it is preferable to use Ta (tantalum), an alloy containing Ta, or a Ta compound containing either of Ta or an alloy containing Ta and at least one selected from boron, nitrogen, oxygen, and carbon. Examples of the Ta compound include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, and TaSiCON.

As a material containing tantalum (Ta) or chromium (Cr), the amount of nitrogen (N) present in a surface layer thereof is preferably small. Specifically, the nitrogen content in the surface layer of the conductive back film 5 of the material containing tantalum (Ta) or chromium (Cr) is preferably less than 5 atomic %, and more preferably, the surface layer contains substantially no nitrogen. This is because in the conductive back film 5 of the material containing tantalum (Ta) or chromium (Cr), the lower the nitrogen content in the surface layer is, the higher wear resistance is.

The conductive back film 5 preferably contains a material containing tantalum and boron. The conductive back film 5 contains a material containing tantalum and boron, and a conductive film 23 having wear resistance and chemical resistance can be thereby obtained. When the conductive back film 5 contains tantalum (Ta) and boron (B), the content of B is preferably 5 to 30 atomic %. A ratio between Ta and B (Ta:B) in a sputtering target used for forming the conductive back film 5 is preferably from 95:5 to 70:30.

The thickness of the conductive back film 5 is not particularly limited as long as a function of the conductive back film 5 for an electrostatic chuck is satisfied. The thickness of the conductive back film 5 is usually 10 nm to 200 nm. In addition, the conductive back film 5 further adjusts a stress on the second main surface side of the mask blank 100. The conductive back film 5 is adjusted such that the flat reflective mask blank 100 can be obtained in balance with a stress from various films formed on the first main surface side.

Reflective Mask 200 and Method for Manufacturing the Same

The reflective mask 200 according to the present embodiment has the absorber pattern 4a in which the absorber film 4 of the above-described reflective mask blank 100 is partnered.

Since the absorber pattern 4a of the reflective mask 200 absorbs EUV light and can reflect the EUV light at an opening of the absorber pattern 4a, a predetermined fine transfer pattern can be transferred onto a transfer target object by irradiating the reflective mask 200 with the EUV light using a predetermined optical system.

The reflective mask 200 is manufactured using the reflective mask blank 100 according to the present embodiment. Here, an outline description will be only given, and a detailed description will be given later in Examples. In addition, here, a case where the reflective mask blank 100 includes the etching mask film 6 as illustrated in FIGS. 3A to 3E will be described.

Figure 3A:
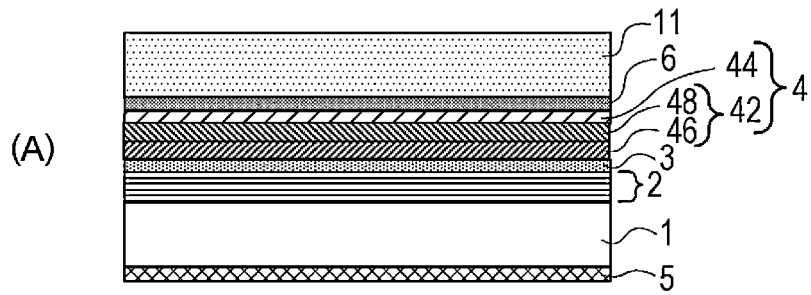
FIGS. 3A to 3E are an example of a flow sheet illustrating a schematic cross-sectional view of a main part of a process for manufacturing a reflective mask from a reflective mask blank.
Figure 3B:
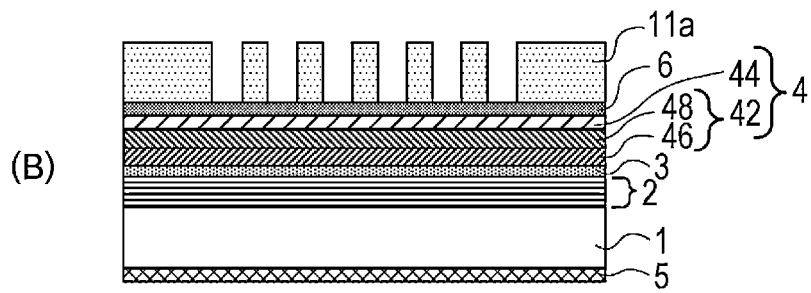

The reflective mask blank 100 is prepared, the resist film 11 is formed on the etching mask film 6 formed on the absorber film 4 on a side of a first main surface thereof (see FIG. 3A, this is unnecessary in a case where the resist film 11 is provided as the reflective mask blank 100), and a desired pattern is drawn (exposed) on the resist film 11 and further developed and rinsed to form a predetermined resist pattern 11a (see FIG. 3B).

Figure 3C:
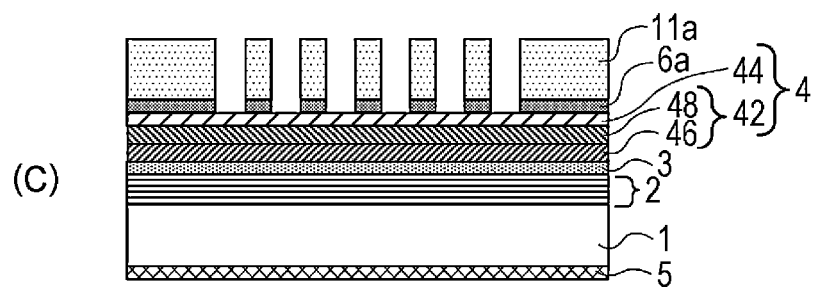
Figure 3D:
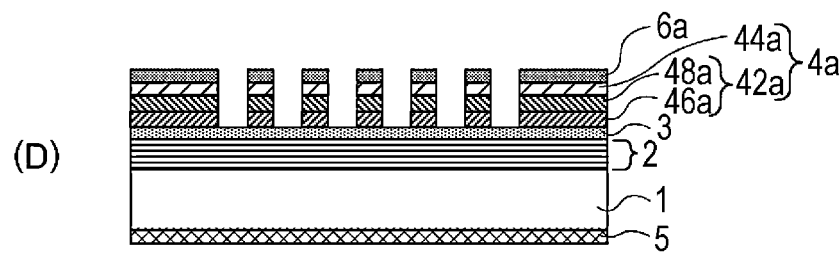
Figure 3E:
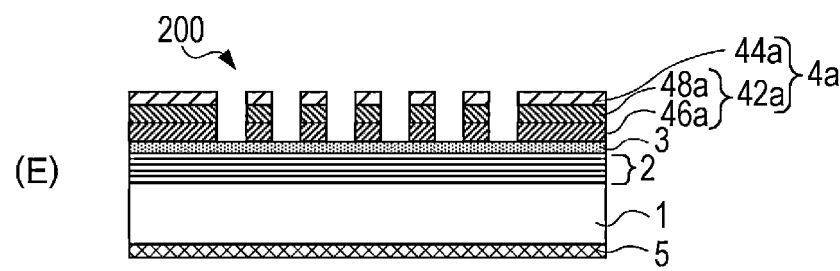

In the case of the reflective mask blank 100, the etching mask film 6 is etched using the resist pattern 11a as a mask to form an etching mask pattern 6a (sec FIG. 3C). The resist pattern 11a is peeled off by oxygen ashing or a wet treatment with hot sulfuric acid or the like. Next, the absorber film 4 (the reflectance adjustment layer 44 and the absorption layer 42) is etched using the etching mask pattern 6a as a mask to form the absorber pattern 4a (the reflectance adjustment layer pattern 44a and the absorption layer pattern 42a) (see FIG. 3D). The etching mask pattern 6a is removed to form the absorber pattern 4a (the reflectance adjustment layer pattern 44a and the absorption layer pattern 42a) (see FIG. 3E). Finally, by performing wet cleaning using an acidic or alkaline aqueous solution, the reflective mask 200 can be manufactured.

Note that the etching mask pattern 6a can be removed by etching the etching mask pattern 6a simultaneously with the absorption layer 42 at the time of patterning the absorption layer 42.

In the reflective mask 200 according to the present embodiment, the etching mask pattern 6a can be left on the absorber pattern 4a without being removed. However, in this case, it is necessary to leave the etching mask pattern 6a as a uniform thin film. In the reflective mask 200 according to the present embodiment, it is preferable to remove the etching mask pattern 6a without disposing the etching mask pattern 6a from a viewpoint of avoiding non-uniformity of the etching mask pattern 6a as a thin film.

In a method for manufacturing the reflective mask 200 according to the present embodiment, the etching mask film 6 of the above-described reflective mask blank 100 according to the present embodiment is preferably patterned by a dry etching gas containing a chlorine-based gas and an oxygen gas. In a case of the etching mask film 6 containing chromium (Cr), dry etching can be suitably performed using a chlorine-based gas and an oxygen gas. In addition, the reflectance adjustment layer 44 is preferably patterned with a dry etching gas containing a fluorine-based gas. In a case of the reflectance adjustment layer 44 made of a material containing tantalum (Ta) and oxygen (O), dry etching can be suitably performed using a fluorine-based gas. The absorption layer 42 is preferably patterned with a dry etching gas containing a fluorine-based gas or a chlorine-based gas not containing oxygen. In a case of the absorption layer 42 made of a material containing tantalum (Ta) and nitrogen (N), dry etching can be suitably performed using a fluorine-based gas or a chlorine-based gas not containing oxygen. In this manner, the absorber pattern 4a of the reflective mask 200 can be formed.

Through the above steps, it is possible to obtain the reflective mask 200 capable of suppressing peeling of the absorber pattern 4a when EUV exposure is performed in an atmosphere containing a hydrogen gas.

Method for Manufacturing Semiconductor Device

A method for manufacturing a semiconductor device according to the present embodiment includes a step of setting the reflective mask 200 according to the present embodiment in an exposure apparatus including an exposure light source that emits EUV light, and transferring a transfer pattern onto a resist film formed on a transfer target substrate.

In the method for manufacturing a semiconductor device according to the present embodiment, since a semiconductor device is manufactured using the above-described reflective mask blank 100, it is possible to suppress peeling of the absorber pattern 4a when EUV exposure is performed in an atmosphere containing a hydrogen gas using the reflective mask 200 according to the present embodiment. Therefore, at the time of manufacturing a semiconductor device, it is possible to manufacture a semiconductor device having a fine and highly accurate transfer pattern with a high yield.

By performing EUV exposure using the above reflective mask 200 according to the present embodiment, a desired transfer pattern based on the absorber pattern 4a on the reflective mask 200 can be formed on a semiconductor substrate. Through various steps such as etching of a film to be processed, formation of an insulating film and a conductive film, introduction of a dopant, and annealing in addition to this lithography step, it is possible to manufacture a semiconductor device in which a desired electronic circuit is formed.

More specifically, an EUV exposure apparatus includes a laser plasma light source that generates EUV light, an illumination optical system, a mask stage system, a reduction projection optical system, a wafer stage system, vacuum equipment, and the like. The light source includes a debris trap function, a cut filter that cuts light having a long wavelength other than exposure light, equipment for vacuum differential pumping, and the like. The illumination optical system and the reduction projection optical system each include a reflection mirror. The reflective mask 200 for EUV exposure is electrostatically attracted by a conductive film formed on a second main surface of the reflective mask 200 and is mounted on a mask stage.

Light of the EUV light source is emitted to the reflective mask 200 through the illumination optical system at an angle tilted by 6° to 8° with respect to a vertical plane of the reflective mask 200. Reflected light from the reflective mask 200 with respect to this incident light is reflected (regularly reflected) in a direction opposite to an incident direction at the same angle as an incident angle, guided to a reflective projection system usually having a reduction ratio of ¼, and exposed on a resist on a wafer (semiconductor substrate) mounted on a wafer stage. During this time, at least a place through which EUV light passes is evacuated. Note that in order to prevent exposure contamination, a hydrogen gas is introduced into an atmosphere during exposure. In addition, when this exposure is performed, mainstream exposure is scan exposure in which a mask stage and a wafer stage are synchronously scanned at a speed corresponding to a reduction ratio of the reduction projection optical system, and exposure is performed through a slit. Then, by developing this resist film that has been subjected to exposure, a resist pattern can be formed on the semiconductor substrate. In the present embodiment, the reflective mask 200 capable of suppressing peeling of the absorber pattern 4a when EUV exposure is performed in an atmosphere containing a hydrogen gas is used. Therefore, even if the reflective mask 200 according to the present embodiment is repeatedly used for EUV exposure, a resist pattern formed on the semiconductor substrate is a desired one with high dimensional accuracy. Then, by performing etching or the like using this resist pattern as a mask, a predetermined wiring pattern can be formed, for example, on the semiconductor substrate. Through such an exposure step, a step of processing a film to be processed, a step of forming an insulating film and a conductive film, a dopant introduction step, an annealing step, and other necessary steps, the semiconductor device is manufactured.

EXAMPLES

Hereinafter, Examples will be described with reference to the drawings. Note that in Examples, the same reference signs will be used for similar constituent elements, and description thereof will be simplified or omitted.

In the following description, an elemental composition of Ta, B, N, and O of a formed thin film was measured by X-ray photoelectron spectroscopy (XPS), and an elemental composition of H was measured by elastic recoil detection analysis (ERDA).

Example 1

Figure 4A:
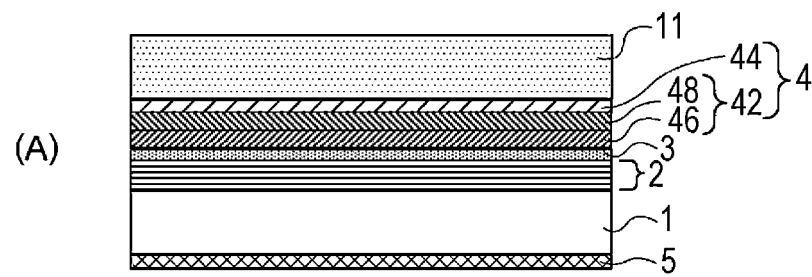
FIGS. 4A to 4E are another example of the flow sheet illustrating a schematic cross-sectional view of a main part of a process for manufacturing a reflective mask from a reflective mask blank.

A reflective mask blank 100 of Example 1 will be described. As illustrated in FIG. 2, the reflective mask blank 100 of Example 1 includes a conductive back film 5, a substrate 1, a multilayer reflective film 2, a protective film 3, and an absorber film 4. The absorber film 4 includes an absorption layer 42 and a reflectance adjustment layer 44. The absorption layer 42 includes a lower surface region 46 as a lower layer and an upper surface region 48 as an upper layer. Then, as illustrated in FIG. 4A, a resist film 11 is formed on the absorber film 4. FIGS. 4A to 4E are schematic cross-sectional views of a main part illustrating a process for manufacturing a reflective mask 200 from the reflective mask blank 100.

The substrate 1 used in Example 1 was manufactured as follows. That is, a $SiO_2$—$TiO_2$-based glass substrate, which is a low thermal expansion glass substrate having a size of 6025 (approximately 152 mm×152 mm×6.35 mm) and having both a first main surface and a second main surface polished, was prepared and used as the substrate 1. The main surfaces were subjected to polishing including a rough polishing step, a precision polishing step, a local processing step, and a touch polishing step such that the main surfaces were flat and smooth.

The conductive back film 5 formed of a CrN film was formed on the second main surface (back surface) of the $SiO_2$—$TiO_2$-based glass substrate 1 by a magnetron sputtering (reactive sputtering) method under the following conditions.

Conditions for forming conductive back film 5: a Cr target, a mixed gas atmosphere of Ar and $N_2$ (Ar: 90%, N: 10%), and a film thickness of 20 nm.

Next, the multilayer reflective film 2 was formed on the main surface (first main surface) of the substrate 1 on a side opposite to a side on which the conductive back film 5 was formed. The multilayer reflective film 2 formed on the substrate 1 was a periodic multilayer reflective film 2 containing Mo and Si in order to make the multilayer reflective film 2 suitable for EUV light having a wavelength of 13.5 nm. The multilayer reflective film 2 was formed using a Mo target and a Si target by alternately building up a Mo layer and a Si layer on the substrate 1 by an ion beam sputtering method in an Ar gas atmosphere. First, a Si film was formed with a thickness of 4.2 nm, and subsequently a Mo film was formed with a thickness of 2.8 nm. This formation was counted as one period, and the Si film and the Mo film were built up for 40 periods in a similar manner. Finally, a Si film was formed with a thickness of 4.0 nm to form the multilayer reflective film 2. The number of periods was 40 here, but the number of periods is not limited thereto and may be, for example, 60. In the case of 60 periods, the number of steps is larger than the number of steps in the case of 40 periods, but reflectance for EUV light can be increased.

Subsequently, the protective film 3 formed of a RuNb film was formed with a film thickness of 2.5 nm using a RuNb target in an Ar gas atmosphere by an ion beam sputtering method.

Next, an absorber film 4 including an absorption layer 42 (a lower surface region 46 as a lower layer and an upper surface region 48 as an upper layer) and a reflectance adjustment layer 44 was formed on the protective film 3. Note that Table 1 indicates materials, film thicknesses, types of targets and film forming gases used in film formation (sputtering), hydrogen (H) contents, boron (B) contents, and composition ratios among materials of the protective film 3, the absorption layer 42 (lower layer and upper layer), and the reflectance adjustment layer 44 of Example 1. In Table 1, "at %" indicating the content of a material and a composition ratio means atomic %. In Table 1, "RMS (nm)" indicates root mean square roughness (RMS) of a mask blank after the absorber film 4 is formed.

Specifically, first, a lower layer (lower surface region 46) of the absorption layer 42 formed of a TaBNH film was formed by a DC magnetron sputtering method. The TaBNH film was formed with the film thickness indicated in Table 1 by reactive sputtering in a mixed gas atmosphere of a Xe gas, a $N_2$ gas, and a $H_2$ gas using a TaB mixed sintering target.

Next, an upper layer (upper surface region 48) of the absorption layer 42 formed of a TaBN film was formed by a DC magnetron sputtering method. The TaBN film was formed with the film thickness indicated in Table 1 by reactive sputtering in a mixed gas atmosphere of a Xe gas and a $N_2$ gas using a TaB mixed sintering target.

Table 1 indicates elemental ratios of a TaBNH film (lower surface region 46 as a lower layer) and a TaBN film (upper surface region 48 as an upper layer) of Example 1.

Next, the reflectance adjustment layer 44 formed of a TaBO film was formed by a magnetron sputtering method. The TaBO film was formed with a film thickness indicated in Table 1 by reactive sputtering in a mixed gas atmosphere of an Ar gas and an $O_2$ gas using a TaB mixed sintering target.

Table 1 indicates an elemental ratio of the TaBO film (reflectance adjustment layer 44) of Example 1. In addition, Table 1 indicates root mean square roughness RMS after the TaBO film (reflectance adjustment layer 44) is formed.

As described above, the reflective mask blank 100 of Example 1 was manufactured.

Next, using the above reflective mask blank 100 of Example 1, a reflective mask 200 of Example 1 was manufactured.

Figure 4B:
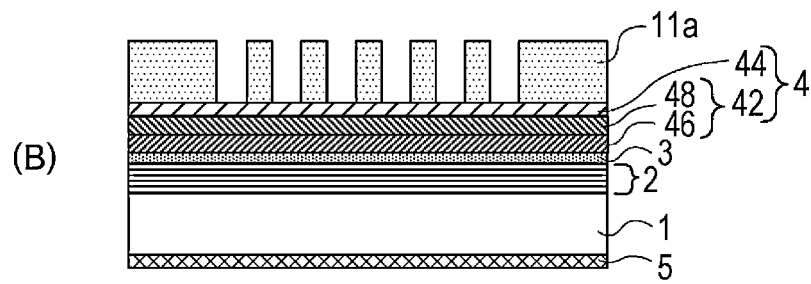
Figure 4C:
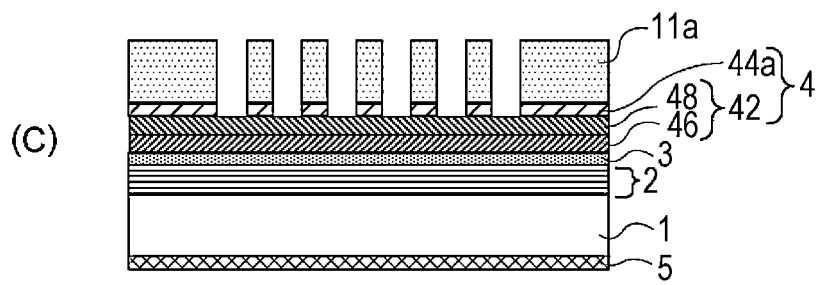
Figure 4D:
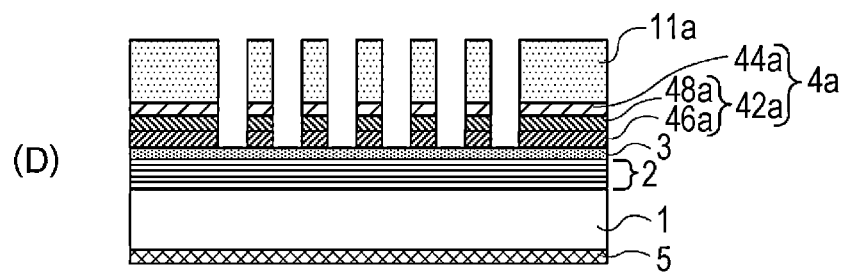

The resist film 11 was formed with a thickness of 150 nm on the absorber film 4 of the reflective mask blank 100 (FIG. 4A). A chemically amplified resist (CAR) was used for forming the resist film 11. A desired pattern was drawn (exposed) on this resist film 11, and further developed and rinsed to form a predetermined resist pattern 11a (FIG. 4B). Next, dry etching of the TaBO film (reflectance adjustment layer 44) was performed using a $CF_4$ gas using the resist pattern 11a as a mask to form a reflectance adjustment layer pattern 44a (FIG. 4C). Thereafter, the TaBN film (upper surface region 48 as an upper layer) and the TaBNH film (lower surface region 46 as a lower layer) were patterned by dry etching using a $Cl_2$ gas to form an absorption layer pattern 42a (FIG. 4D).

Figure 4E:
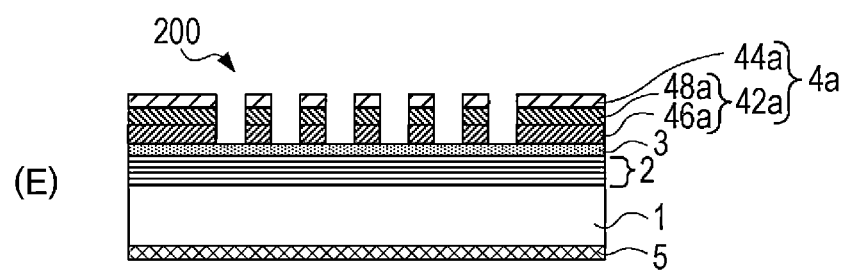

Thereafter, the resist pattern 11a was peeled off by oxygen ashing (FIG. 4E). Finally, wet cleaning was performed with deionized water (DIW) to manufacture the reflective mask 200 of Example 1.

Note that a mask defect inspection can be performed as necessary after wet cleaning, and a mask defect can be corrected appropriately.

The reflective mask 200 manufactured in Example 1 was set in an EUV scanner, and EUV exposure was performed on a wafer on which a film to be processed and a resist film were formed on a semiconductor substrate. In order to prevent exposure contamination, a hydrogen gas was introduced into an atmosphere during exposure at the time of EUV exposure. Then, this resist film that had been subjected to exposure was developed, and a resist pattern was thereby formed on the semiconductor substrate on which the film to be processed was formed.

This resist pattern was transferred onto the film to be processed by etching, and through various steps such as formation of an insulating film and a conductive film, introduction of a dopant, and annealing, a semiconductor device having desired characteristics could be manufactured.

Using the reflective mask 200 of Example 1, EUV exposure was performed by repeatedly introducing a hydrogen gas into the atmosphere during exposure 1000 times. After exposure was performed 1000 times, film peeling of the absorber pattern 4a of the reflective mask 200 of Example 1 was evaluated, and it was confirmed that film peeling had not occurred.

Example 2

A reflective mask blank 100 of Example 2 will be described. The reflective mask blank 100 of Example 2 is similar to the reflective mask blank 100 of Example 1 except that the hydrogen content and film thickness of a lower layer (lower surface region 46) of an absorption layer 42 are different from those of Example 1. Table 1 indicates a composition of the absorption layer 42 (lower layer and upper layer) of Example 2. That is, in the reflective mask blank 100 of Example 2, only a flow rate of a $H_2$ gas among gases mixed at the time of reactive sputtering and film forming time were changed so as to have the composition of the lower surface region 46 as a lower layer indicated in Table 1 at the time of forming the absorption layer 42.

Table 1 indicates an elemental ratio of a TaBNH film (lower surface region 46 as a lower layer) of Example 2. Note that elemental ratios of a TaBO film (reflectance adjustment layer 44) and a TaBN film (upper surface region 48 as an upper layer) of Example 2 were the same as those of Example 1.

As described above, the reflective mask blank 100 of Example 2 was manufactured.

Next, a reflective mask 200 of Example 2 was manufactured using the reflective mask blank 100 of Example 2 in a manner similar to Example 1. As in Example 1, film peeling of an absorber pattern 4a of the reflective mask 200 of Example 2 was evaluated, and it was confirmed that film peeling had not occurred.

Example 3

A reflective mask blank 100 of Example 3 will be described. The reflective mask blank 100 of Example 3 is similar to the reflective mask blank 100 of Example 1 except that neither an absorption layer 42 (lower layer and upper layer) nor a reflectance adjustment layer 44 contains boron (B). Table 1 indicates the compositions of the absorption layer 42 (lower layer and upper layer) and the reflectance adjustment layer 44 of Example 3. That is, in the reflective mask blank 100 of Example 3, a Ta target containing no boron (B) was used as a target at the time of reactive sputtering so as to have the composition of the reflectance adjustment layer 44 indicated in Table 1 when the absorption layer 42 (lower layer and upper layer) and the reflectance adjustment layer 44 were formed. Note that the mixed gas at the time of reactive sputtering is similar to that in Example 1.

Table 1 indicates elemental ratios of a TaNH film (lower surface region 46 as a lower layer), a TaN film (upper surface region 48 as an upper layer), and a TaO film (reflectance adjustment layer 44) of Example 3.

As described above, the reflective mask blank 100 of Example 3 was manufactured.

Next, a reflective mask 200 of Example 3 was manufactured using the reflective mask blank 100 of Example 3 in a manner similar to Example 1. As in Example 1, film peeling of an absorber pattern 4a of the reflective mask 200 of Example 3 was evaluated, and it was confirmed that film peeling had not occurred.

Example 4

A reflective mask blank 100 of Example 4 will be described. The reflective mask blank 100 of Example 4 is similar to the reflective mask blank 100 of Example 1 except that a lower layer which is a lower surface region 46 of an absorption layer 42 does not contain hydrogen (H) and an upper layer which is an upper surface region 48 of the absorption layer 42 contains hydrogen (H). Table 1 indicates the composition of the absorption layer 42 (lower surface region 46 as a lower layer and upper surface region 48 as an upper layer) of Example 4. That is, in the reflective mask blank 100 of Example 4, a mixed gas of a Xe gas and a $N_2$ gas was used as a mixed gas at the time of reactive sputtering without using a $H_2$ gas so as to have the composition of the TaBN film as a lower layer indicated in Table 1 at the time of forming the lower layer which is the lower surface region 46. In addition, a mixed gas of a Xe gas, a $N_2$ gas, and a $H_2$ gas was used as a mixed gas at the time of reactive sputtering so as to have the composition of the TaBNH film as an upper layer indicated in Table 1 at the time of forming the upper layer which is the upper surface region 48.

Table 1 indicates elemental ratios of a TaBN film (lower surface region 46 as a lower layer) and a TaBNH film (upper surface region 48 as an upper layer) of Example 4. Note that an elemental ratio of a TaBO film (reflectance adjustment layer 44) of Example 4 was the same as that of Example 1.

As described above, the reflective mask blank 100 of Example 4 was manufactured.

Next, a reflective mask 200 of Example 4 was manufactured using the reflective mask blank 100 of Example 4 in a manner similar to Example 1. At this time, as an absorber pattern 4a, a region where a pattern was sparse and a region where a pattern was dense were formed. As in Example 1, film peeling of the absorber pattern 4a of the reflective mask 200 of Example 4 was evaluated, and it was confirmed that film peeling had occurred in the region where a pattern was sparse, but film peeling had not occurred in the region where a pattern was dense.

Example 5

A reflective mask blank 100 of Example 5 will be described. The reflective mask blank 100 of Example 5 is similar to the reflective mask blank 100 of Example 1 except that a lower layer which is a lower surface region 46 of an absorption layer 42, an upper layer which is an upper surface region 48 of the absorption layer 42, and a reflectance adjustment layer 44 each contain hydrogen (H). Table 1 indicates the compositions of the absorption layer 42 (lower surface region 46 as a lower layer and upper surface region 48 as an upper layer) and the reflectance adjustment layer 44 of Example 5. That is, in the reflective mask blank 100 of Example 5, a mixed gas of a Xe gas, a $N_2$ gas, and a $H_2$ gas was used as a mixed gas at the time of reactive sputtering so as to have the compositions of the TaNH films of the lower layer and the upper layer indicated in Table 1. In addition, a mixed gas of an Ar gas, an $O_2$ gas, and a $H_2$ gas was used as a mixed gas at the time of reactive sputtering so as to have the composition of a TaOH film indicated in Table 1 at the time of forming the reflectance adjustment layer 44.

Table 1 indicates elemental ratios of the TaNH film (lower surface region 46 as a lower layer), the TaNH film (upper surface region 48 as an upper layer), and the TaOH film (reflectance adjustment layer 44) of Example 5.

As described above, the reflective mask blank 100 of Example 5 was manufactured.

Next, a reflective mask 200 of Example 5 was manufactured using the reflective mask blank 100 of Example 5 in a manner similar to Example 1. At this time, as an absorber pattern 4a, a region where a pattern was sparse and a region where a pattern was dense were formed. As in Example 1, film peeling of the absorber pattern 4a of the reflective mask 200 of Example 5 was evaluated, and it was confirmed that film peeling had occurred in neither the region where a pattern was sparse nor the region where a pattern was dense.

Example 6

A reflective mask blank 100 of Example 6 will be described. The reflective mask blank 100 of Example 6 is similar to the reflective mask blank 100 of Example 1 except that an absorption layer 42 contains deuterium (D) (instead of hydrogen (H)). Table 1 indicates compositions of a TaBND film (lower surface region 46 as a lower layer) and a TaBN film (upper surface region 48 as an upper layer) of Example 6. That is, in the reflective mask blank 100 of Example 6, the TaBND film was formed using a $D_2$ gas instead of a $H_2$ gas among gases mixed at the time of reactive sputtering so as to have the composition of the TaBND film (lower surface region 46 as a lower layer) indicated in Table 1 at the time of forming the absorption layer 42.

Table 1 indicates elemental ratios of the TaBND film (lower surface region 46 as a lower layer) and the TaBN film (upper surface region 48 as an upper layer) of Example 6. Note that an elemental ratio of a TaBO film (reflectance adjustment layer 44) of Example 6 was the same as that of Example 1.

As described above, the reflective mask blank 100 of Example 6 was manufactured.

Next, a reflective mask 200 of Example 6 was manufactured using the reflective mask blank 100 of Example 6 in a manner similar to Example 1. As in Example 1, film peeling of an absorber pattern 4a of the reflective mask 200 of Example 5 was evaluated, and it was confirmed that film peeling had not occurred.

Comparative Example 1

As Comparative Example 1, a mask blank 100 including a TaBN film as an absorption layer 42 was manufactured. Comparative Example 1 is basically similar to Example 1 except that the absorption layer 42 is a TaBN film (single layer film). The TaBN film of the absorption layer 42 was formed in a similar manner to the TaBN film which is the upper layer of the absorption layer 42 of Example 1.

Next, as in Example 1, a reflective mask 200 of Comparative Example 1 was manufactured using the reflective mask blank 100 of Comparative Example 1.

The reflective mask 200 manufactured in Comparative Example 1 was set in an EUV scanner, and EUV exposure was performed on a wafer on which a film to be processed and a resist film were formed on a semiconductor substrate. In order to prevent exposure contamination, a hydrogen gas was introduced into an atmosphere during exposure at the time of EUV exposure. Then, this resist film that had been subjected to exposure was developed, and a resist pattern was thereby formed on the semiconductor substrate on which the film to be processed was formed.

Using the reflective mask 200 of Comparative Example 1, EUV exposure was performed by repeatedly introducing a hydrogen gas into the atmosphere during exposure 1000 times. After exposure was performed 1000 times, film peeling of the absorber pattern 4a of the reflective mask 200 of Comparative Example 1 was evaluated, and it was confirmed that film peeling had occurred.

TABLE 1

|  |  | Example 1 | Example 2 | Example 3 | Example 4 | Example 5 | Example 6 |
|---|---|---|---|---|---|---|---|
|  | RMS (nm) | 0.308 | 0.333 | 0.427 | 0.295 | 0.347 | 0.269 |
| Reflectance adjustment layer | Material | TaBO | TaBO | TaO | TaBO | TaOH | TaBO |
|  | Film thickness (nm) | 14 | 14 | 14 | 14 | 14 | 14 |
|  | Target | TaB alloy | TaB alloy | Ta | TaB alloy | Ta | TaB alloy |
|  | Film forming gas | Ar, $O_2$ | Ar, $O_2$ | Ar, $O_2$ | Ar, $O_2$ | Ar, $O_2$, $H_2$ | Ar, $O_2$ |
|  | Content of H (at %) | None | None | None | None | 15 at % | None |
|  | Content of B (at %) | 6 at % | 6 at % | None | 6 at % | None | 6 at % |
|  | Composition ratio | Ta:B:O = 41:6:53 | Ta:B:O = 41:6:53 | Ta:O = 44:56 | Ta:B:O = 41:6:53 | Ta:O:H = 31:54:15 | Ta:B:O = 41:6:53 |
| Absorption layer (Upper layer) | Material | TaBNH | TaBNH | TaN | TaBNH | TaNH | TaBN |
|  | Film thickness (nm) | 48 | 48 | 48 | 48 | 5 | 48 |
|  | Target | Ta:B = 80:20 | Ta:B = 80:20 | Ta | Ta:B = 80:20 | Ta | Ta:B = 80:20 |
|  | Film forming gas | Xe, $N_2$ | Xe, $N_2$ | Xe, $N_2$ | Xe, $N_2$, $H_2$ | Xe, $N_2$, $H_2$ | Xe, $N_2$ |
|  | Content of H (at %) | None | None | None | 7 at % | 7 at % | None |
|  | Content of B (at %) | 17 at % | 17 at % | None | 13 at % | None | 17 at % |
|  | Composition ratio | Ta:B:N = 71:17:12 | Ta:B:N = 71:17:12 | Ta:N = 71:29 | Ta:B:N:H = 51:13:29:7 | Ta:N:H = 67:26:7 | Ta:B:N = 71:17:12 |

TABLE 1-continued

|  |  | Example 1 | Example 2 | Example 3 | Example 4 | Example 5 | Example 6 |
|---|---|---|---|---|---|---|---|
| Absorption layer (Lower layer) | Material | TaBNH | TaBNH | TaNH | TaBN | TaNH | TaBND |
|  | Film thickness (nm) | 8 | 8 | 8 | 48 | 51 | 8 |
|  | Target | Ta:B = 80:20 | Ta:B = 80:20 | Ta | Ta:B = 80:20 | Ta | Ta:B = 80:20 |
|  | Film forming gas | Xe, $N_2$, $H_2$ | Xe, $N_2$, $H_2$ | Xe, $N_2$, $H_2$ | Xe, $N_2$ | Xe, $N_2$, $H_2$ | Xe, $N_2$, $D_2$ |
|  | Content of H (at %) | 7 at % | 23 at % | 7 at % | None | 3 at % | 11 at % |
|  | Content of B (at %) | 13 at % | 10 at % | None | 17 at % | None | 11 at % |
|  | Composition ratio | Ta:B:N:H = 51:13:29:7 | Ta:B:N:H = 42:10:25:23 | Ta:N:H = 67:26:7 | Ta:B:N = 71:17:12 | Ta:N:H = 69:28:3 | Ta:B:N:H = 49:11:29:11 |
| Protective film | Material | RuNb | RuNb | RuNb | RuNb | RuNb | RuNb |
|  | Film thickness (nm) | 2.5 | 2.5 | 2.5 | 2.5 | 2.5 | 2.5 |

REFERENCE SIGNS LIST

1 Substrate
2 Multilayer reflective film
3 Protective film
4 Absorber film
4a Absorber pattern
5 Conductive back film
6 Etching mask film
6a Etching mask pattern
11 Resist film
11a Resist pattern
42 Absorption layer
42a Absorption layer pattern
44 Reflectance adjustment layer
44g Reflectance adjustment layer pattern
46 Lower surface region
48 Upper surface region
100 Reflective mask blank
200 Reflective mask

The invention claimed is:

1. A reflective mask blank comprising:
a substrate;
a multilayer reflective film on the substrate;
a protective film on the multilayer reflective film; and
an absorber film on the protective film, wherein
the protective film comprises ruthenium (Ru) and at least one additive element selected from hydrogen (H) and deuterium (D).

2. The reflective mask blank according to claim 1, wherein the absorber film comprises at least one additive element selected from hydrogen (H) and deuterium (D).

3. The reflective mask blank according to claim 1, wherein the absorber film comprises tantalum (Ta).

4. The reflective mask blank according to claim 2, wherein a concentration (atomic %) of the additive element in the protective film is higher than a concentration (atomic %) of the additive element in the absorber film.

5. The reflective mask blank according to claim 1, wherein the absorber film comprises a layer in contact with the protective film,
the layer comprises tantalum (Ta) and at least one additive element selected from hydrogen (H) and deuterium (D).

6. The reflective mask blank according to claim 5, wherein a concentration (atomic %) of the additive element in the protective film is higher than a concentration (atomic %) of the additive element in the layer of the absorber film.

7. The reflective mask blank according to claim 1, wherein a total concentration (atomic %) of the additive element in the protective film is more than 5 atomic %.

8. A reflective mask comprising a substrate; a multilayer reflective film on the substrate; a protective film on the multilayer reflective film; and an absorber film having a pattern on the protective film, wherein
the protective film comprises ruthenium (Ru) and at least one additive element selected from hydrogen (H) and deuterium (D).

9. The reflective mask according to claim 8, wherein the absorber film comprises at least one additive element selected from hydrogen (H) and deuterium (D).

10. The reflective mask according to claim 8, wherein the absorber film comprises tantalum (Ta).

11. The reflective mask according to claim 9, wherein a concentration (atomic %) of the additive element in the protective film is higher than a concentration (atomic %) of the additive element in the absorber film.

12. The reflective mask according to claim 8, wherein the absorber film comprises a layer in contact with the protective film,
the layer comprises tantalum (Ta) and at least one additive element selected from hydrogen (H) and deuterium (D).

13. The reflective mask according to claim 12, wherein a concentration (atomic %) of the additive element in the protective film is higher than a concentration (atomic %) of the additive element in the layer of the absorber film.

14. The reflective mask according to claim 8, wherein a total concentration (atomic %) of the additive element in the protective film is more than 5 atomic %.

15. A method for manufacturing a semiconductor device, the method comprising: setting the reflective mask according to claim 8 in an exposure apparatus comprising an exposure light source that emits EUV light; and irradiating the reflective mask with the EUV light to transfer a transfer pattern to a resist film formed on a transfer target substrate.

* * * * *